United States Patent
Enicks

(10) Patent No.: US 8,173,526 B2
(45) Date of Patent: May 8, 2012

(54) METHOD FOR PROVIDING A NANOSCALE, HIGH ELECTRON MOBILITY TRANSISTOR (HEMT) ON INSULATOR

(75) Inventor: Darwin G. Enicks, Colorado Springs, CO (US)

(73) Assignee: Atmel Corporation, San Jose, CA (US)

(*) Notice: Subject to any disclaimer, the term of this patent is extended or adjusted under 35 U.S.C. 154(b) by 190 days.

(21) Appl. No.: 12/489,353

(22) Filed: Jun. 22, 2009

(65) Prior Publication Data

US 2009/0258478 A1    Oct. 15, 2009

Related U.S. Application Data

(62) Division of application No. 11/554,796, filed on Oct. 31, 2006, now Pat. No. 7,550,758.

(51) Int. Cl.
  *H01L 21/04* (2006.01)
(52) U.S. Cl. .................. 438/510; 257/E21.049
(58) Field of Classification Search .................. 438/459, 438/510; 257/E21.049
  See application file for complete search history.

(56) References Cited

U.S. PATENT DOCUMENTS

| | | | |
|---|---|---|---|
| 4,459,739 A | 7/1984 | Shepard et al. |
| 4,652,183 A | 3/1987 | Veltri et al. |
| 4,701,423 A | 10/1987 | Szluk |
| 4,908,325 A | 3/1990 | Berenz |
| 5,137,838 A | 8/1992 | Ramde et al. |
| 5,155,571 A | 10/1992 | Wang et al. |
| 5,241,214 A | 8/1993 | Herbots |
| 5,331,659 A | 7/1994 | Ohata et al. |
| 5,378,901 A | 1/1995 | Nii |
| 5,466,949 A | 11/1995 | Okuno |
| 5,569,538 A | 10/1996 | Cho |
| 5,620,907 A | 4/1997 | Jalali-Farahani et al. |
| 5,661,059 A | 8/1997 | Liu et al. |
| 5,686,350 A | 11/1997 | Lee et al. |
| 5,804,834 A | 9/1998 | Shimoyama et al. |
| 5,856,685 A | 1/1999 | Nakayama |
| 5,906,708 A | 5/1999 | Robinson et al. |
| 5,906,951 A | 5/1999 | Chu et al. |
| 5,965,931 A | 10/1999 | Wang et al. |
| 6,059,895 A | 5/2000 | Chu et al. |
| 6,064,081 A | 5/2000 | Robinson et al. |
| 6,087,683 A | 7/2000 | King et al. |
| 6,107,647 A | 8/2000 | Matsumoto et al. |
| 6,165,891 A | 12/2000 | Chooi et al. |
| 6,323,108 B1 | 11/2001 | Kub et al. |

(Continued)

FOREIGN PATENT DOCUMENTS

WO    WO-2007001672 A2    1/2007

(Continued)

OTHER PUBLICATIONS

"U.S. Appl. No. 11/467,480, Notice of Allowance mailed Jan. 12, 2010", 7 pgs.

(Continued)

*Primary Examiner* — William D Coleman
(74) *Attorney, Agent, or Firm* — Fish & Richardson P.C.

(57) ABSTRACT

Various embodiments include forming a silicon-germanium layer over a substrate of a device; forming a layer in the silicon-germanium layer, the layer including at least one of boron and carbon; and forming a silicon layer over the silicon-germanium layer. Additional embodiments are described.

22 Claims, 8 Drawing Sheets

U.S. PATENT DOCUMENTS

| | | |
|---|---|---|
| 6,399,970 B2 | 6/2002 | Kubo et al. |
| 6,512,252 B1 | 1/2003 | Takagi et al. |
| 6,521,041 B2 | 2/2003 | Wu et al. |
| 6,531,369 B1 | 3/2003 | Ozkan et al. |
| 6,552,375 B2 | 4/2003 | Swanson et al. |
| 6,586,297 B1 | 7/2003 | U'Ren et al. |
| 6,593,625 B2 | 7/2003 | Christiansen et al. |
| 6,656,809 B2 | 12/2003 | Greenberg et al. |
| 6,667,489 B2 | 12/2003 | Suzumura et al. |
| 6,670,542 B2 | 12/2003 | Sakata et al. |
| 6,670,654 B2 | 12/2003 | Lanzerotti et al. |
| 6,680,494 B2 | 1/2004 | Gutierrez-Aitken et al. |
| 6,709,903 B2 | 3/2004 | Christiansen et al. |
| 6,744,079 B2 | 6/2004 | Jagannathan et al. |
| 6,746,902 B2 | 6/2004 | Maa et al. |
| 6,750,484 B2 | 6/2004 | Lippert et al. |
| 6,759,694 B1 | 7/2004 | Hsu et al. |
| 6,780,796 B2 | 8/2004 | Maa et al. |
| 6,781,214 B1 | 8/2004 | U'Ren et al. |
| 6,787,822 B1 | 9/2004 | Nuyen |
| 6,841,457 B2 | 1/2005 | Bedell et al. |
| 6,855,649 B2 | 2/2005 | Christiansen et al. |
| 6,855,963 B1 | 2/2005 | Chu et al. |
| 6,858,541 B2 | 2/2005 | Horning |
| 6,876,010 B1 | 4/2005 | Fitzgerald |
| 6,900,115 B2 | 5/2005 | Todd |
| 6,906,400 B2 | 6/2005 | Delhougne et al. |
| 6,927,140 B2 | 8/2005 | Soman et al. |
| 6,936,910 B2 | 8/2005 | Ellis-Monaghan et al. |
| 6,963,089 B2 | 11/2005 | Shi et al. |
| 6,992,004 B1 | 1/2006 | Besser et al. |
| 6,995,430 B2 | 2/2006 | Langdo et al. |
| 7,074,623 B2 | 7/2006 | Lochtefeld et al. |
| 7,091,114 B2 | 8/2006 | Ito et al. |
| 7,227,176 B2 | 6/2007 | Wu et al. |
| 7,273,799 B2 | 9/2007 | Todd |
| 7,495,250 B2 | 2/2009 | Enicks |
| 7,550,758 B2 | 6/2009 | Enicks |
| 7,569,913 B2 | 8/2009 | Enicks et al. |
| 2002/0081861 A1 | 6/2002 | Robinson et al. |
| 2002/0105015 A1 | 8/2002 | Kubo et al. |
| 2002/0185686 A1 | 12/2002 | Christiansen et al. |
| 2003/0040130 A1 | 2/2003 | Mayur et al. |
| 2003/0080394 A1 | 5/2003 | Babcock et al. |
| 2003/0082882 A1 | 5/2003 | Babcock et al. |
| 2003/0098465 A1 | 5/2003 | Suzumura et al. |
| 2003/0129802 A1 | 7/2003 | Lanzerotti et al. |
| 2003/0132453 A1 | 7/2003 | Greenberg et al. |
| 2003/0140844 A1 | 7/2003 | Maa et al. |
| 2003/0143783 A1 | 7/2003 | Maa et al. |
| 2003/0146448 A1 | 8/2003 | U'Ren et al. |
| 2003/0159644 A1 | 8/2003 | Yonehara et al. |
| 2003/0201468 A1 | 10/2003 | Christiansen et al. |
| 2003/0218189 A1 | 11/2003 | Christiansen et al. |
| 2004/0009649 A1 | 1/2004 | Kub et al. |
| 2004/0031979 A1 | 2/2004 | Lochtefeld et al. |
| 2004/0048447 A1 | 3/2004 | Kondo |
| 2004/0063293 A1 | 4/2004 | Greenberg et al. |
| 2004/0079989 A1 | 4/2004 | Kaneko et al. |
| 2004/0087097 A1* | 5/2004 | Lai et al. ............... 438/376 |
| 2004/0087119 A1 | 5/2004 | Maa et al. |
| 2004/0164336 A1 | 8/2004 | Weimer et al. |
| 2004/0222486 A1 | 11/2004 | Ellis-Monaghan et al. |
| 2004/0227158 A1* | 11/2004 | Delhougne et al. ........... 257/202 |
| 2004/0251458 A1 | 12/2004 | Mizushima et al. |
| 2004/0253776 A1 | 12/2004 | Hoffmann et al. |
| 2005/0045905 A1 | 3/2005 | Chu et al. |
| 2005/0045962 A1 | 3/2005 | Iwata et al. |
| 2005/0048745 A1 | 3/2005 | Todd |
| 2005/0051798 A1 | 3/2005 | Lanzerotti et al. |
| 2005/0051861 A1 | 3/2005 | Shi et al. |
| 2005/0092235 A1 | 5/2005 | Brabant et al. |
| 2005/0112857 A1 | 5/2005 | Gluschenkov et al. |
| 2005/0127392 A1 | 6/2005 | Chu et al. |
| 2005/0181555 A1 | 8/2005 | Haukka et al. |
| 2005/0191911 A1 | 9/2005 | Greenberg et al. |
| 2005/0230705 A1 | 10/2005 | Taylor |
| 2005/0233534 A1 | 10/2005 | Lanzerotti et al. |
| 2005/0250289 A1 | 11/2005 | Babcock et al. |
| 2005/0280103 A1 | 12/2005 | Langdo et al. |
| 2006/0011906 A1 | 1/2006 | Bedell et al. |
| 2006/0030093 A1 | 2/2006 | Zhang et al. |
| 2006/0068557 A1 | 3/2006 | Ochimizu et al. |
| 2006/0121692 A1 | 6/2006 | Shiota et al. |
| 2006/0151787 A1 | 7/2006 | Chen et al. |
| 2006/0157733 A1 | 7/2006 | Lucovsky et al. |
| 2006/0186510 A1 | 8/2006 | Lochtefeld et al. |
| 2006/0231862 A1 | 10/2006 | Otsuka et al. |
| 2006/0273392 A1 | 12/2006 | Ito et al. |
| 2006/0284165 A1 | 12/2006 | Berger et al. |
| 2006/0292809 A1 | 12/2006 | Enicks et al. |
| 2007/0048992 A1 | 3/2007 | Hosokawa et al. |
| 2007/0054460 A1 | 3/2007 | Enicks |
| 2007/0087507 A1 | 4/2007 | Liu et al. |
| 2007/0096142 A1 | 5/2007 | Tachibana et al. |
| 2007/0102834 A1 | 5/2007 | Enicks et al. |
| 2007/0105335 A1 | 5/2007 | Fitzgerald |
| 2007/0148890 A1 | 6/2007 | Enicks et al. |
| 2007/0262295 A1 | 11/2007 | Enicks |
| 2007/0290193 A1 | 12/2007 | Tucker |
| 2008/0050883 A1 | 2/2008 | Enicks |
| 2008/0099754 A1 | 5/2008 | Enicks |
| 2008/0099840 A1 | 5/2008 | Enicks |
| 2008/0099882 A1 | 5/2008 | Enicks |
| 2008/0237716 A1 | 10/2008 | Enicks et al. |

FOREIGN PATENT DOCUMENTS

| | | |
|---|---|---|
| WO | WO-2007001672 A3 | 1/2007 |
| WO | WO-2007056708 A2 | 5/2007 |
| WO | WO-2007079372 A2 | 7/2007 |
| WO | WO-2007133949 A1 | 11/2007 |
| WO | WO-2008024587 A2 | 2/2008 |
| WO | WO-2008024587 A3 | 2/2008 |
| WO | WO-2008054957 A1 | 5/2008 |
| WO | WO-2008054967 A2 | 5/2008 |
| WO | WO-2008054967 A3 | 5/2008 |
| WO | WO-2008057692 A2 | 5/2008 |
| WO | WO-2008057692 A3 | 5/2008 |
| WO | WO-2008057695 A1 | 5/2008 |

OTHER PUBLICATIONS

"U.S. Appl. No. 11/554,430, Notice of Allowance mailed Jan. 19, 2010", 5 pgs.

"U.S. Appl. No. 11,166,287, Response filed Jun. 30, 2008 to Non-Final Office Action mailed Apr. 3, 2008", 16 pgs.

"U.S. Appl. No. 11/166,287, Restriction Requirement mailed Jan. 16, 2008", 5 pgs.

"U.S. Appl. No. 11/166,287, Final Office Action mailed Jun. 1, 2009", 13 pgs.

"U.S. Appl. No. 11/166,287, Non-Final Office Action mailed Apr. 3, 2008", 11 pgs.

"U.S. Appl. No. 11/166,287, Non-Final Office Action mailed Nov. 4, 2008", 13 pgs.

"U.S. Appl. No. 11/166,287, Notice of Allowance mailed Oct. 8, 2009", 8 pgs.

"U.S. Appl. No. 11/166,287, Response filed Jan. 23, 2008 to Restriction Requirement mailed Jan. 16, 2008", 1 pg.

"U.S. Appl. No. 11/166,287, Response filed Feb. 3, 2009 to Non-Final Office Action mailed Nov. 4, 2008", 20 pgs.

"U.S. Appl. No. 11/166,287, Response filed Sep. 1, 2009 to Final Office Action mailed Jun. 1, 2009", 15 pgs.

"U.S. Appl. No. 11/467,480, Final Office Action mailed Aug. 20, 2008", 9 pgs.

"U.S. Appl. No. 11/467,480, Non-Final Office Action mailed Feb. 21, 2008", 3 pgs.

"U.S. Appl. No. 11/467,480, Notice of Allowance mailed Mar. 9, 2009", 4 pgs.

"U.S. Appl. No. 11/467,480, Notice of Allowance mailed Jul. 6, 2009", 5 pgs.

"U.S. Appl. No. 11/467,480, Response filed Jan. 21, 2008 to Restriction Requirement mailed Jan. 8, 2008", 1 pg.

"U.S. Appl. No. 11/467,480, Response filed May 21, 2008 to Non-Final Office Action mailed Feb. 21, 2008", 18 pgs.

"U.S. Appl. No. 11/467,480, Response filed Dec. 19, 2008 to Final Office Action mailed Aug. 20, 2008", 13 pgs.

"U.S. Appl. No. 11/467,480, Restriction Requirement mailed Jan. 8, 2008", 6 pgs.

"U.S. Appl. No. 11/553,313, Amendment and Response filed Apr. 2, 2008 to Non-Final Office Action maied Jan. 2, 2008", 8 pgs.

"U.S. Appl. No. 11/553,313, Non-Final Office Action mailed Jan. 2, 2008", 12 pgs.

"U.S. Appl. No. 11/553,313, Notice of Allowance mailed Feb. 25, 2009", 6 pgs.

"U.S. Appl. No. 11/553,313, Notice of Allowance mailed Jun. 2, 2008", 6 pgs.

"U.S. Appl. No. 11/553,313, Notice of Allowance mailed Jun. 16, 2009", 6 pgs.

"U.S. Appl. No. 11/553,313, Notice of Allowance mailed Sep. 25, 2008", 6 pgs.

"U.S. Appl. No. 11/553,333, Amendment and Response filed Jun. 30, 2008 to Non-Final Office Action mailed Apr. 3, 2008", 13 pgs.

"U.S. Appl. No. 11/553,333, Non-Final Office Action mailed Apr. 3, 2008", 7 pgs.

"U.S. Appl. No. 11/553,333, Notice of Allowance mailed Jan. 2, 2009", 5 pgs.

"U.S. Appl. No. 11/553,333, Notice of Allowance mailed Sep. 8, 2008", 5 pgs.

"U.S. Appl. No. 11/553,333, Response filed Jun. 30, 2008 to Non-Final Office Action mailed Apr. 3, 2008", 13 pgs.

"U.S. Appl. No. 11/554,430, Non-Final Office Action mailed Sep. 30, 2008", 11 pgs.

"U.S. Appl. No. 11/554,430, Notice of Allowance mailed Aug. 4, 2009", 7 pgs.

"U.S. Appl. No. 11/554,430, Response and Preliminary Amendment filed Apr. 11, 2008 to Restriction Requirement mailed Mar. 13, 2008", 9 pgs.

"U.S. Appl. No. 11/554,430, Response filed Dec. 30, 2008 to Non Final Office Action mailed Sep. 30, 2008", 15 pgs.

"U.S. Appl. No. 11/554,430, Restriction Requirement mailed Mar. 13, 2008", 6 pgs.

"U.S. Appl. No. 11/554,796, Notice of Allowance mailed Jan. 5, 2009", 17 pgs.

"U.S. Appl. No. 11/554,796, Restriction Requirement mailed Aug. 7, 2008", 6 pgs.

"U.S. Appl. No. 12/114,571, Amendment and Response filed Feb. 5, 2009 to Non-Final Office Action mailed Nov. 5, 2008", 13 pgs.

"U.S. Appl. No. 12/114,571, Final Office Action mailed Nov. 6, 2009", 3 pgs.

"U.S. Appl. No. 12/114,571, Non-Final Office Action mailed Nov. 5, 2008", 13 pgs.

"U.S. Appl. No. 12/114,571, Notice of Allowance mailed Apr. 24, 2009", 7 pgs.

"International Application Serial No. PCT/US07/80723, International Search Report mailed Mar. 6, 2008", 2 pgs.

"International Application Serial No. PCT/US07/80723, Written Opinion mailed Mar. 6, 2008", 5 pgs.

"International Application Serial No. PCT/US07/80830, International Search Report mailed Mar. 6, 2008", 2 pgs.

"International Application Serial No. PCT/US07/80830, Written Opinion mailed Mar. 6, 2008", 4 pgs.

"International Application Serial No. PCT/US07/80994, International Search Report mailed May 7, 2008", 2 pgs.

"International Application Serial No. PCT/US07/80994, Written Opinion mailed May 7, 2008", 6 pgs.

"International Application Serial No. PCT/US2007/074232, International Search Report mailed Jun. 18, 2008", 2 pgs.

"International Application Serial No. PCT/US2007/074232, Written Opinion mailed Jun. 18, 2008", 5 pgs.

"Internatonal Application Serial No. PCT/US07/80772, International Search Report mailed Feb. 29, 2008", 2 pgs.

"Internatonal Application Serial No. PCT/US07/80772, Written Opinion mailed Feb. 29, 2008", 6 pgs.

"Properties of Silicon Germanium and SiGe: Carbon", *Book; INSPEC*, (2000), 14 pgs.

Enicks, D., "A Study of Process-Induced Oxygen Updiffusion in Pseudomorphic Boron-Doped Sub-50 nm SiGeC Layers Grown by LPCVD", *Electrochemical and Solid-State Letters*, 8(10), (2005), G286-G289.

Enicks, D., "Enhanced Carbon Confinement of Ultra Narrow Boron Profiles in SiGeC HBTs", *IEEE Transactions on Electronic Devices*, 53(8), (2006), 6 pgs.

Enicks, D., et al., "Thermal Redistribution of Oxygen and Carbon in Boron-Doped Pseudomorphic SiGeC Heterojunction Nanometer Base Layers", *Journal of the Electrochemical Society*, 153(6), (2006), G529-G533.

Enicks, Darwin, "Pseudomorphic Growth of Sub-40 nm $Si_{1-y}Ge_xC_y$ by LPCVD with Enhanced Boron Confinement and Carrier Transport for Advanced NPN HBTs", *White Paper from Atmel Corporation*, (Aug. 2003), 11 pgs.

Enicks, Darwin G, et al., "Thermal Redistribution of Oxygen and Carbon in Sub-50 NM Strained Layers of Boron Doped SiGeC", *ECS Transactions*, vol. 3, No. 7, (2006), 1087-1098.

Gosele, Ulrich, et al., "Chapter 7—Thinning Procedures", *Science and Technology of Semiconductor Wafer Bonding*, [online]. [retrieved Aug. 24, 2006]. Retrieved from the Internet : <URL: http://www.duke.edu/web/wbl/ch7/ch7-hpge.html>, 17 pgs.

Houghton, D. C., "Strain relaxation kinetics in $Si1−xGex/Si$ heterostructures", *J. Appl. Physics*, 70(4), 1991 American Institute of Physics, Institute for Microstructural Sciences, National Research Counsel, Canada, (Aug. 15, 1991), 2136-2151.

Kar, G. S, et al., "Effect of carbon on lattice strain and hole mobility in $Si1-xGex$ alloys", *Journal of Materials Science: Materials in Electronics*, 13(1), 2002 Kluwer Academic Publishers, U.S., (Jan. 2002), 49-55.

Kasper, E., et al., *Properties of Silicon Germanium and SiGe: Carbon*, EMIS Datareviews Series No. 24, INSPEC, The Institute of Electrical Engineers, London, United Kingdom, (2000), 358 pgs.

Knoll, D., et al., "Influence of the Oxygen content in SiGe on the Parameters of Si/SiGe Heterojunction Bipolar Transistors", *Journal of Electronic Materials* 27(9), (1998), 1022-1026.

Matthews, J. W., et al., "Defects in Epitaxial Multilayers", *Journal of Crystal Growth*, 27, (1974), 118-125.

Neimash, M. V., et al., "Oxygen Precipitation and Thermal Donor Formation in Pb and C Doped n-Type Czochralski Silicon", *Proceedings, Electrochemical Society—2004 Joint International Meeting*, (Abstract 1075), (2004), 1 pg.

Pavesi, L., "A Review of the Various Efforts to a Silicon Laser", *Optoelectronic Integration on Silicon—Proceedings of SPIE*, (Photonic West, San Diego, CA, (2003), 15 pgs.

People, R., "Calculation of critical layer thickness versus lattice mismatch for $GexSi1-x/Si$ strained-layer heterostructures", *Applied Physics Letters*, 47(3), (1985), 322-324.

Rafi, J. M., et al., "Analysis of Oxygen Thermal Donor Formation in n-type Cz Silicon", *In: Analytical and Diagnostic Techniques for Semiconductor Materials, Devices, and Processes*, (Electrochemical Society), (2003), 1 pg.

\* cited by examiner

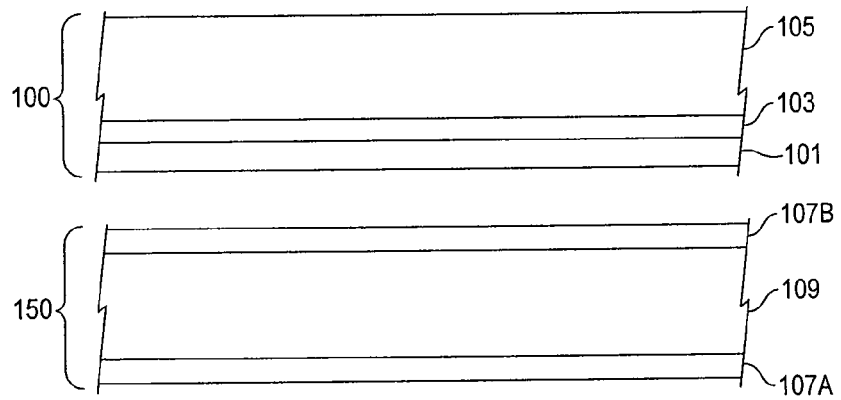
Fig._1A *(Prior Art)*
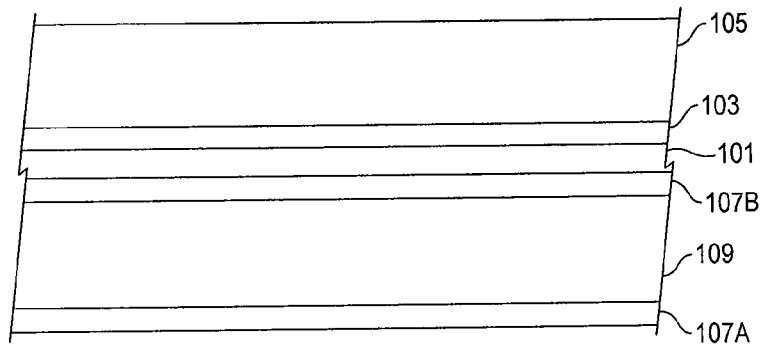
Fig._1B *(Prior Art)*
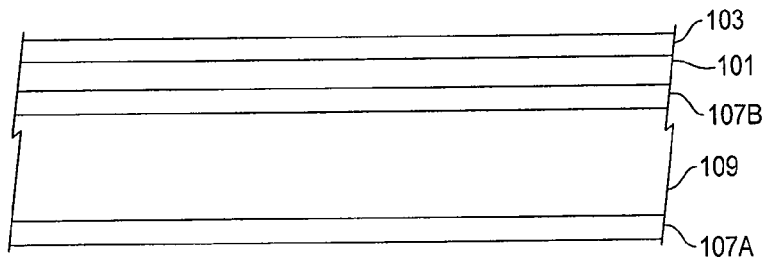
Fig._1C *(Prior Art)*
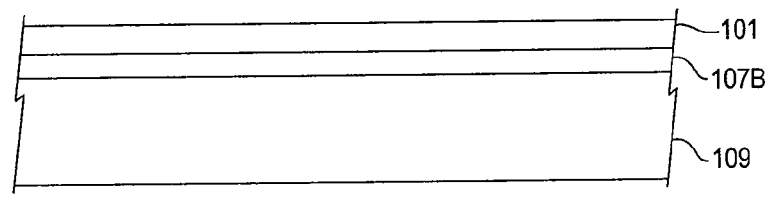
Fig._1D *(Prior Art)*

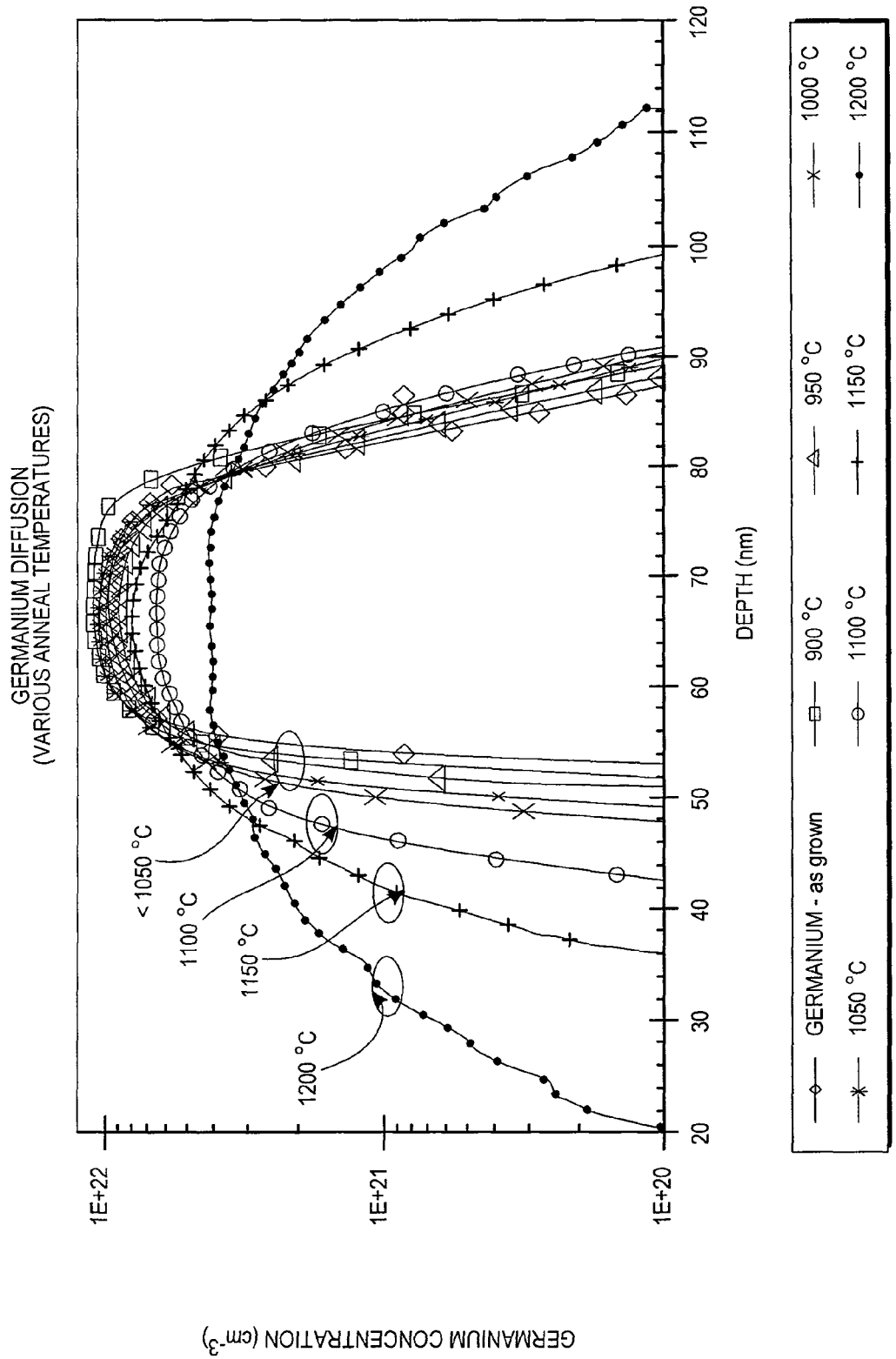
Fig._3

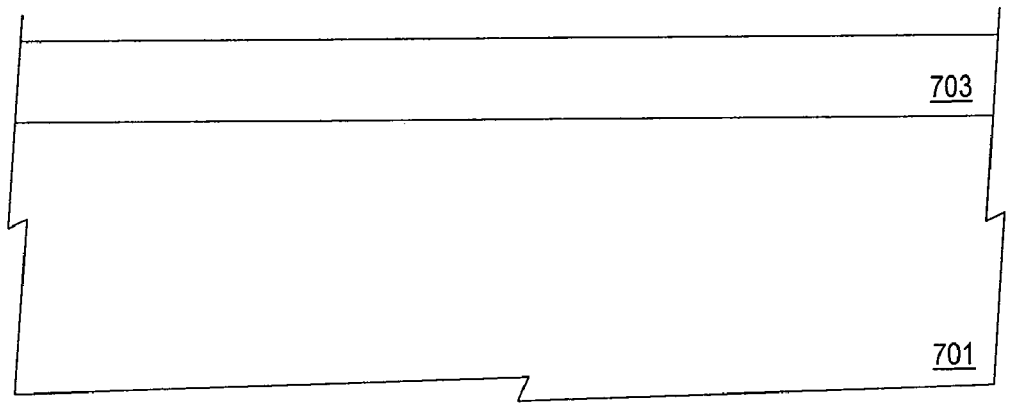
Fig._7A
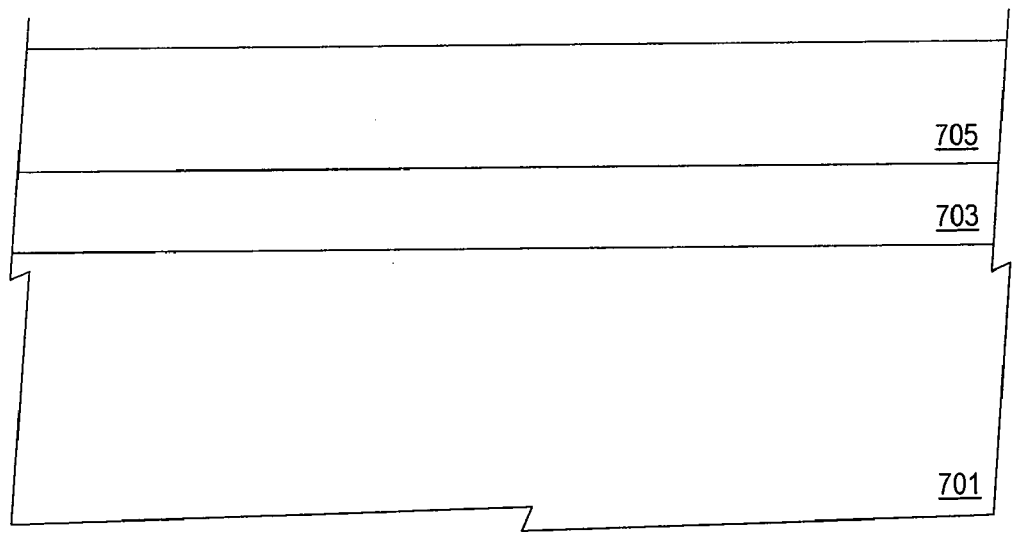
Fig._7B

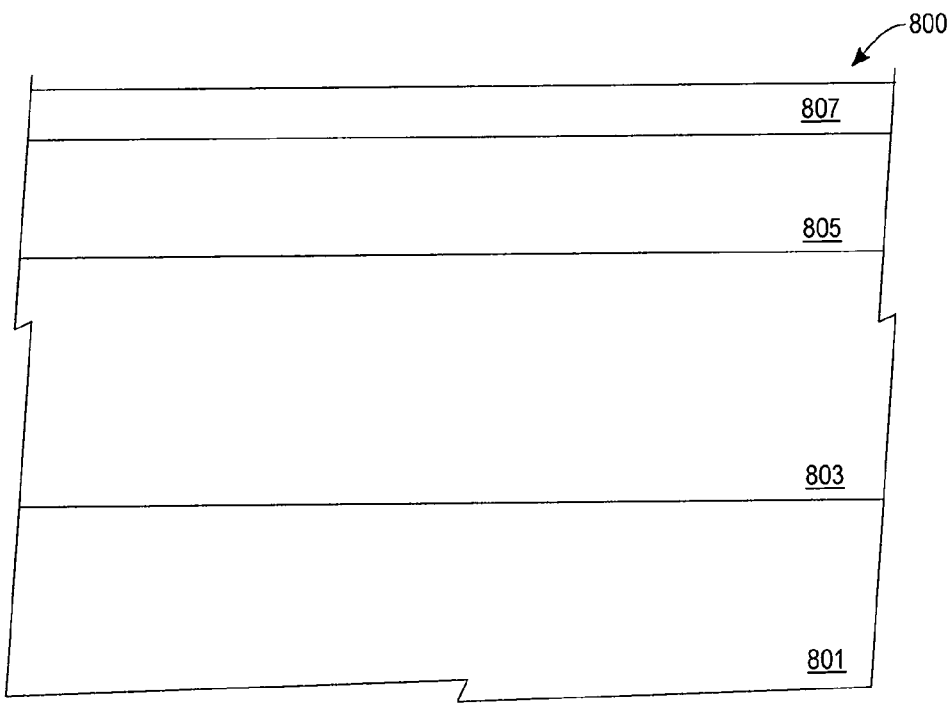
Fig._8
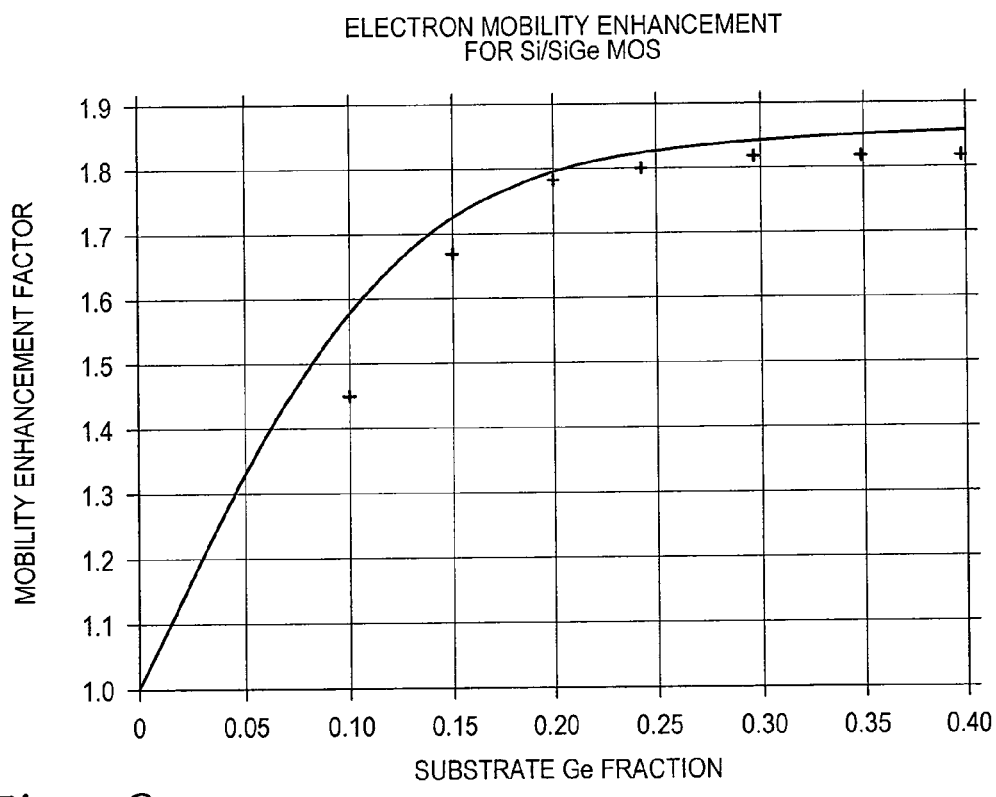
Fig._9

METHOD FOR PROVIDING A NANOSCALE, HIGH ELECTRON MOBILITY TRANSISTOR (HEMT) ON INSULATOR

RELATED APPLICATIONS

This application is a Divisional of U.S. patent application Ser. No. 11/554,796, filed on Oct. 31, 2006, which is incorporated herein by reference in its entirety.

TECHNICAL FIELD

Embodiments of the invention relate generally to methods of fabrication of integrated circuits (ICs), including a method of fabricating high electron mobility transistors on semiconductor-on-insulator substrates.

BACKGROUND ART

Several material systems have emerged as key facilitators to extend Moore's law well into the next decade. These key facilitators include (1) silicon-on-insulator (SOI), (2) silicon-germanium (SiGe), and (3) strained silicon. With reference to SOI and related technologies, there are numerous advantages associated with an insulating substrate. These advantages include reduced parasitic capacitances, improved electrical isolation, and reduced short-channel-effects. Advantages of SOI can be combined with energy bandgap and carrier mobility improvements offered by $Si_{1-x}Ge_x$ and strained silicon devices.

SOI substrates generally include a thin layer of silicon on top of an insulator. Integrated circuit components are formed in and on the thin layer of silicon. The insulator can comprise insulators such as silicon dioxide ($SiO_2$), sapphire, or various other insulative materials.

Currently, several techniques are available to fabricate SOI substrates. One technique for fabricating SOI substrates is separation by implantation of oxygen (SIMOX). In a SIMOX process, oxygen is implanted below a surface of a silicon wafer. A subsequent anneal step produces a buried silicon dioxide layer with a silicon overlayer. However, the time required for an implantation in a SIMOX process can be extensive and, consequently, cost prohibitive. Moreover, an SOI substrate formed by SIMOX may be exposed to high surface damage and contamination.

Another technique is bond-and-etch-back SOI (BESOI) where an oxidized wafer is first diffusion-bonded to a non-oxidized wafer. With reference to FIG. 1A, a silicon device wafer 100 and a silicon handle wafer 150 comprise major components for forming a BESOI wafer. The silicon device wafer 100 includes a first silicon layer 101, which will serve as a device layer, an etch-stop layer 103, and a second silicon layer 105. The etch-stop layer 103 frequently comprises carbon. The silicon handle wafer 150 includes a lower silicon dioxide layer 107A, a silicon substrate layer 109, and an upper silicon dioxide layer 107B. The lower 107A and upper 107B silicon dioxide layers are frequently thermally grown oxides formed concurrently.

In FIG. 1B, the silicon device wafer 100 and the silicon handle wafer 150 are brought into physical contact and bonded, one to the other. The initial bonding process is followed by a thermal anneal, thus strengthening the bond. The silicon device wafer 100 in the bonded pair is thinned. Initially, most of the second silicon layer 105 is removed by mechanical grinding and polishing until only a few tens of micrometers (i.e. "microns" or μm) remain. A high-selectivity wet or dry chemical etch removes remaining portions of the second silicon layer 105, stopping on the etch-stop layer 103. (Selectivity is discussed in detail, below.) An end-result of the second silicon layer 105 etch process is depicted in FIG. 1C.

During the etching process the silicon handle wafer 150 is protected by a coated mask layer (not shown). In FIG. 1D, the etch-stop layer 103 has been removed using another high-selectivity etchant. As a result of these processes, the first silicon layer 101, serving as a device layer, is transferred to the silicon handle wafer 150. A backside of the silicon substrate layer 109 is ground, polished, and etched to achieve a desired overall thickness.

To ensure BESOI substrates are thin enough for subsequent fabrication steps as well as meeting contemporary demands for ever-decreasing physical size and weight constraints, BESOI requires the presence of the etch-stop layer 103 during the layer transfer process. Currently, two main layer transfer technologies exist: 1) splitting of a hydrogen-implanted layer from a device layer (a hydrogen implantation and separation process), and 2) selective chemical etching. Both technologies have demonstrated they meet requirements of advanced semiconductor processing.

In the hydrogen implantation and separation process, hydrogen ($H_2$) is implanted into silicon having a thermally grown silicon dioxide layer. The implanted $H_2$ produces embrittlement of the silicon substrate underlying the silicon dioxide layer. The $H_2$ implanted wafer may be bonded with a second silicon wafer having a silicon dioxide overlayer. The bonded wafer may be cut across the wafer at a peak location of the hydrogen implant by appropriate annealing.

The BESOI process described is relatively free from ion implant damage inherent in the SIMOX process. However, the BESOI process requires a time consuming sequence of grinding, polishing, and chemical etching.

Contemporary Etch-Stops

As described above, the BESOI process is a manufacturing-oriented technique to build silicon on insulator substrates and is partially dependent upon chemical retching.

Etch-stop performance is described by a mean etch selectivity, S, which defines an etch rate ratio of silicon to the etch-stop layer $$S = \frac{R_{Si}}{R_{es}}$$

where $R_{Si}$ is an etch rate of silicon and $R_{es}$ is an etch rate of the etch-stop. Therefore, a selectivity value where S=1 relates to a case of no etch selectivity.

One method to evaluate etch-stop efficiency is to measure a maximum etch step height across etch-stop and non-etch-stop boundaries. In FIG. 2A, an etch-stop 203A is formed by ion implantation into a portion of a silicon substrate 201A. The etch-stop 203A has a thickness $d_1$ at time t=0 (i.e., prior to application of any etchant). At time t=$t_1$ (FIG. 2B), a partially etched silicon substrate 201B is etched to a depth $h_1$. The etch-stop 203A is now a, partially etched etch-stop 203B. The partially etched etch-stop 203B is etched to a thickness of $d_2$. At time t=$t_2$ (FIG. 2C), the partially etched etch-stop 203B (see FIGS. 2A and 2B) has been completely etched and a fully etched silicon substrate 201C achieves a maximum etch step height of $h_2$. An etch rate of the etch-stop 203A (FIG. 2A) is partially dependent upon both a dopant material implanted as well as an implant profile of the dopant employed. From a practical point of view, the maximum etch step is a critical quantity since it determines an acceptable thickness variation of the device wafer after grinding and polishing prior to etch back, in the BESOI process.

For example, if a maximum etch step is 3 units, the allowable thickness non-uniformity of the device wafer after the usual mechanical thinning procedure should be less than 1.5 units. The mean etch selectivity, S, can be derived from the effective etch-stop layer thickness $d_1$ and the maximum etch step $h_2$ as $$S = \frac{\frac{d_1 + h_2}{t}}{\frac{d_1}{t}}$$

$$\Downarrow$$

$$S = 1 + \frac{h_2}{d_1}$$

where t is the etch time required to reach the maximum etch step height $h_2$. In the prior example, $t_2$ is the etch time required to reach the maximum etch step height $h_2$.

In addition to problems created by reduced selectivity, other problems may arise with using carbon or boron as an etch-stop. A skilled artisan recognizes that carbon diffuses readily in a pure silicon and thus the etch-stop layer readily increases in thickness. Boron also diffuses readily in silicon and grows in thickness after subsequent anneal steps. Carbon and boron etch-stop layers of the prior art are frequently hundreds of nanometers in width (at full-width half-maximum (FWHM)). Therefore, what is needed is an extremely thin and robust etch-stop layer having a high etchant selectivity in comparison with silicon.

SUMMARY

One embodiment includes a high electron mobility transistor comprising a substrate with a relaxed silicon-germanium layer formed over the substrate. The silicon-germanium layer has an etch-stop layer comprising less than about 70% germanium and contains dopant elements of carbon and/or boron. A strained silicon layer is formed over the relaxed silicon-germanium layer and configured to act as quantum well device.

Another embodiment includes a high electron mobility transistor comprising a substrate and a relaxed silicon-germanium layer formed over the substrate. A dopant layer is formed within the relaxed silicon-germanium layer. The dopant layer contains carbon and/or boron and has a full-width half-maximum (FWHM) thickness value of less than approximately 70 nanometers. A strained silicon layer is formed over the relaxed silicon-germanium layer and is configured to act as quantum well device.

Another embodiment includes a method to fabricate a high electron so mobility transistor. The method includes flowing a carrier gas over a substrate in a deposition chamber, flowing a silicon precursor gas over the substrate in the deposition chamber, flowing a germanium precursor gas over the substrate, and forming a relaxed silicon-germanium layer such that the silicon-germanium layer contains less than about 70% germanium. A dopant precursor gas containing carbon and/or boron is flowed over the substrate in the deposition chamber and forms a dopant layer to act as at least a portion of an etch-stop layer. A strained silicon layer is formed over the relaxed silicon-germanium layer to act as a quantum well region. The substrate is annealed to a temperature of 900° C. or greater. A thickness of the dopant layer is maintained to less than 70 nanometers when measured as a full-width half-maximum (FWHM) value.

Another embodiment includes a high electron mobility transistor comprising a substrate, a relaxed silicon-germanium layer formed over the substrate, and a boron layer formed within the relaxed silicon-germanium layer. The boron layer has a full-width half-maximum (FWHM) thickness value of less than approximately 70 nanometers. A strained silicon layer is formed over the relaxed silicon-germanium layer and is configured to act as quantum well device.

Another embodiment includes a high electron mobility transistor comprising a substrate, a relaxed silicon-germanium layer formed over the substrate, and a carbon layer formed within the relaxed silicon-germanium layer. The carbon layer has a full-width half-maximum (FWHM) thickness value of less than approximately 70 nanometers. A strained silicon layer is formed over the relaxed silicon-germanium layer and is configured to act as quantum well device.

BRIEF DESCRIPTION OF THE DRAWINGS

FIGS. 1A-1D are cross-sectional views of a prior art bond and etch back silicon on insulator (BESOI) fabrication technique.

FIG. 3 is a graph indicating germanium diffusion at various anneal temperatures.

FIGS. 7A-7B are cross-sectional views of high electron mobility transistor (HEMT) device layers.

FIG. 8 is a cross-sectional view of a quantum well HEMT device.

FIG. 9 is a graph indicating electron mobility enhancement for a Si/SiGe MOS transistor device.

DETAILED DESCRIPTION

Figure 2A:
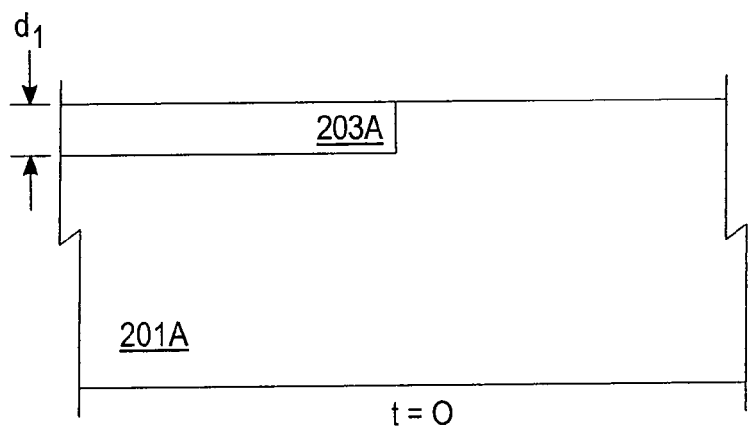
FIGS. 2A-2C are cross-sectional views of an etch-stop formed on a silicon substrate, indicating a method to determine etch-stop efficiency.
Figure 2B:
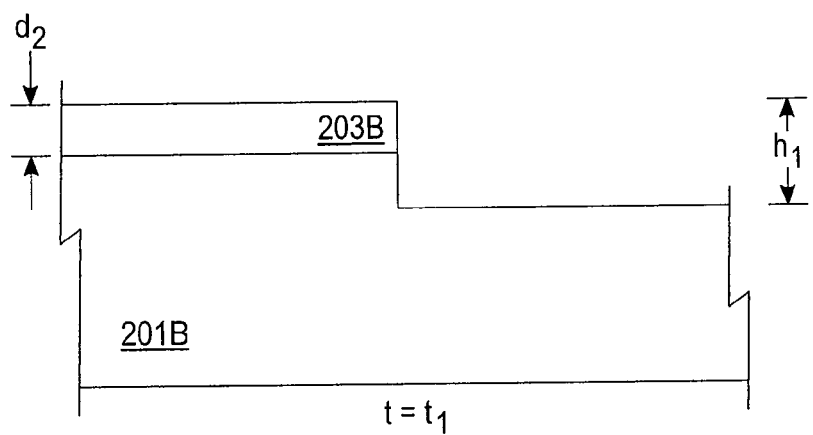
Figure 2C:
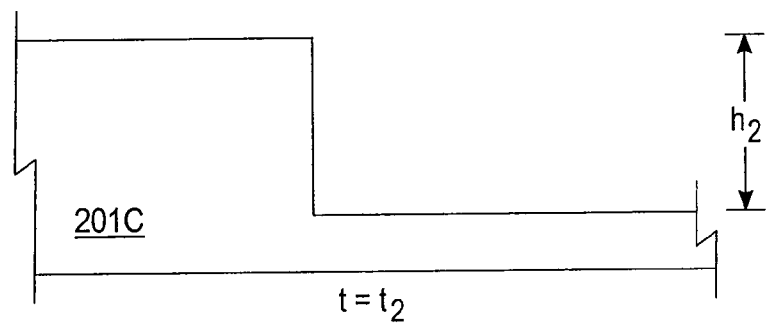

Disclosed herein are a fabrication method and a structure resulting therefrom for a high electron mobility transistor (HEMT) formed on, for example silicon-on-insulator (SOI) containing a silicon (Si), germanium (Ge), and/or silicon-germanium (SiGe) nanoscale etch-stop. Various dopant types, such as boron (B), carbon (C), and germanium are considered for fabricating the nanoscale etch-stop. The nanoscale etch-stop described herein has particular applications in BESOI processing. However, the disclosed etch-stop is not limited only to BESOI applications.

Boron-Doped Silicon

Silicon etch rates of all aqueous alkaline etchants are reduced significantly if silicon is doped with boron in concentrations exceeding $2 \times 10^{19}$ cm$^{-3}$. However, widths of boron in ion implanted profiles can be greater than 200 nm to 300 nm depending on chosen quantities of ion implant energy and dosage. Typically, high dosage requirements also lead to a great deal of concentration-dependent outdiffusion. Therefore, the transferred silicon device layer thickness can exhibit a very wide thickness range since the etch process itself will have a wide profile range over which to stop on the boron-doped layer. The wide layer range poses significant process integration problems. By adding carbon and/or germanium, the boron diffusion can be effectively mitigated at temperatures of approximately 1000° C. for 10 seconds or longer.

A device or substrate designer may prefer boron over carbon and/or Ge as a etch-stop depending on device requirements. For example, a design decision may be driven by a preferred majority carrier type and concentration, or a minority carrier type and concentration. One skilled in the art will recognize that adding carbon to a boron-doped layer will diminish carrier mobility. Consequently, more boron is required to compensate for the diminished carrier effect. A skilled artisan will further recognize that the addition of Ge to form a strained lattice in elemental or compound semiconductors enhances in-plane majority carrier hole mobility but diminishes in-plane majority carrier electron mobility. Therefore, if boron is added to a carbon and/or germanium-doped lattice, the fabrication process must be completely characterized. The process will be a function of gas flows, temperatures, and pressures.

Boron may be doped into either a silicon substrate or film, or a compound semiconductor substrate or film. The compound semiconductor film may be chosen from a Group III-V semiconductor compound such as SiGe, GaAs, or InGaAs. Alternatively, a Group II-VI semiconductor compound may be chosen such as ZnSe, CdSe, or CdTe.

Carbon-Doped and/or Germanium Doped Silicon

Traditional germanium implantation and subsequent thermal anneals result in a germanium profile frequently hundreds of nanometers in depth. This profile range is especially true when subsequent anneal temperatures are over 1000° C. An approximation of an "as-implanted" profile width, measured at FWHM, can be determined as $$\text{width} \cong \frac{\text{dose}}{\text{peak concentration}}$$

An $Si_{1-x-y-z}Ge_xC_yB_z$ Etch-Stop

Using a combined SiGe:C:B approach limits both carbon and boron diffusion in silicon when particular combinations of the elements are used. In an exemplary embodiment, composition ranges for the $Si_{1-x-y-z}Ge_xC_yB_z$ layers are:

x (Ge): 0% up to about 70% ($3.5 \times 10^{22}$ cm$^{-3}$)
y (C): 0 cm$^{-3}$ up to about $5 \times 10^{21}$ cm$^{-3}$
z (B): 0 cm$^{-3}$ up to about $5 \times 10^{21}$ cm$^{-3}$ Secondary-ion mass spectrometry (SIMS) data are displayed, in FIGS. 3-6, for boron, germanium, and carbon diffusion in silicon for various anneal temperatures (or bonding temperatures in the case of BESOI) from 900° C. to 1200° C. for 10 seconds. In particular, FIG. 3 indicates germanium diffusion in silicon at various temperatures. Even at a 1200° C. anneal temperature, a FWHM value of germanium diffusion of approximately 70 nm (i.e., a range of about 30 nm to 100 nm) is achieved. At temperatures of less than 1050° C., a FWHM value of germanium diffusion of less than 40 nm is indicated.

Figure 4:
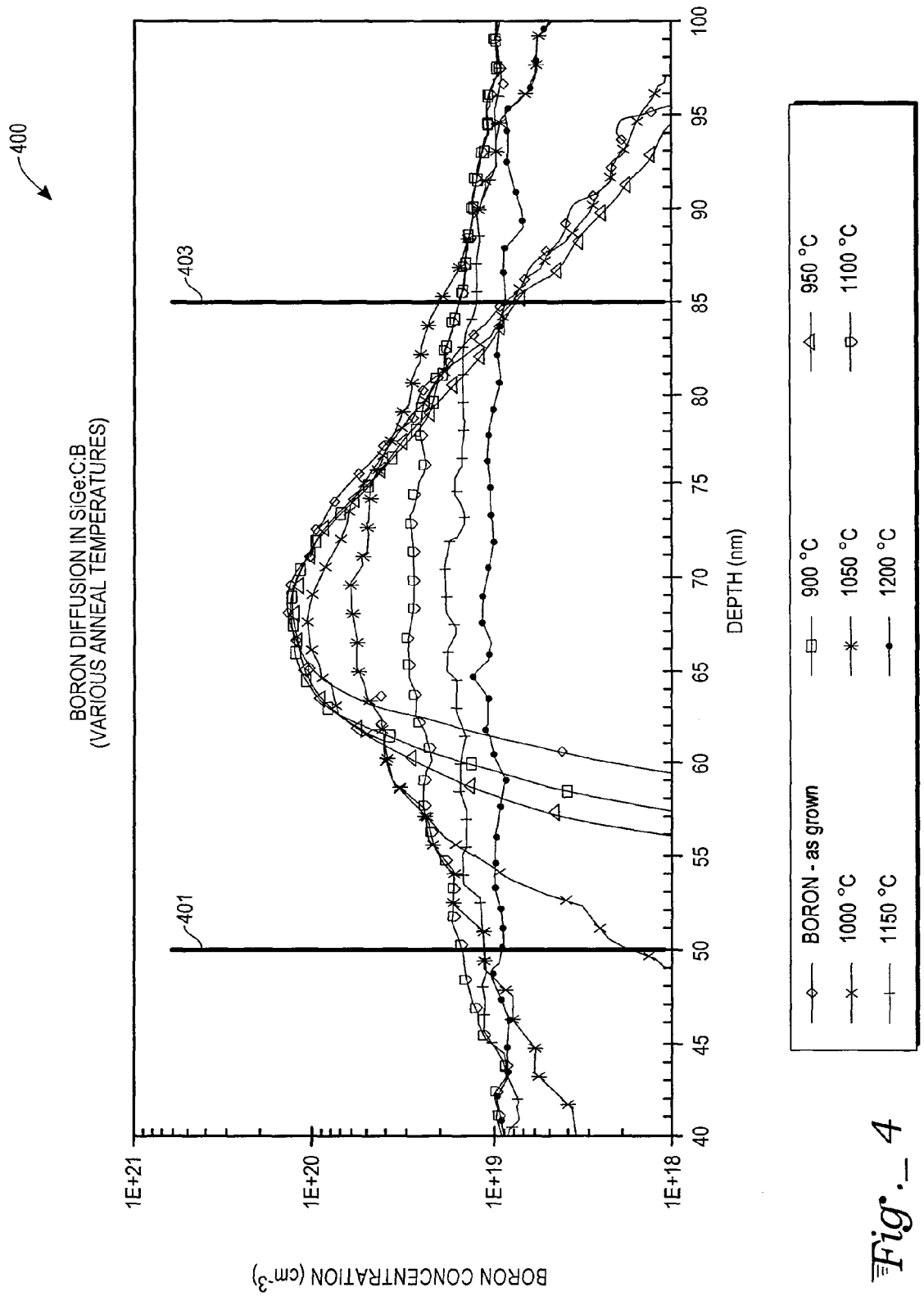
FIG. 4 is a graph indicating a full-width half-maximum (FWHM) depth of a boron profile produced in accordance with the embodiments of the present invention and measured after thermal annealing steps.

With reference to FIG. 4, a SIMS profile graph 400 represents data from a diffusion profile of boron in carbon and Ge-doped silicon (SiGe:C:B). A location of the Ge dopant is illustrated by a lower 401 and an upper 403 vertical line positioned at 50 nm and 85 nm depths, respectively. The boron remains relatively fixed up to temperatures of 1000° C., then diffuses rapidly at higher temperatures (anneal times are 10 seconds at each temperature). However, the presence of both carbon and Ge, as introduced under embodiments of the present invention, reduces boron outdiffusion. Depending on concentrations and temperatures involved, the presence of carbon and Ge reduces overall boron diffusion by a factor of ten or more. In a specific exemplary embodiment, the particular alloy of SiGe:C:B is $Si_{0.975}Ge_{0.02}C_{0.002}B_{0.003}$. Thus, a ratio Of Si to Ge is approximately 50:1 and a ratio of B to C is approximately 1.5:1.

Figure 5:
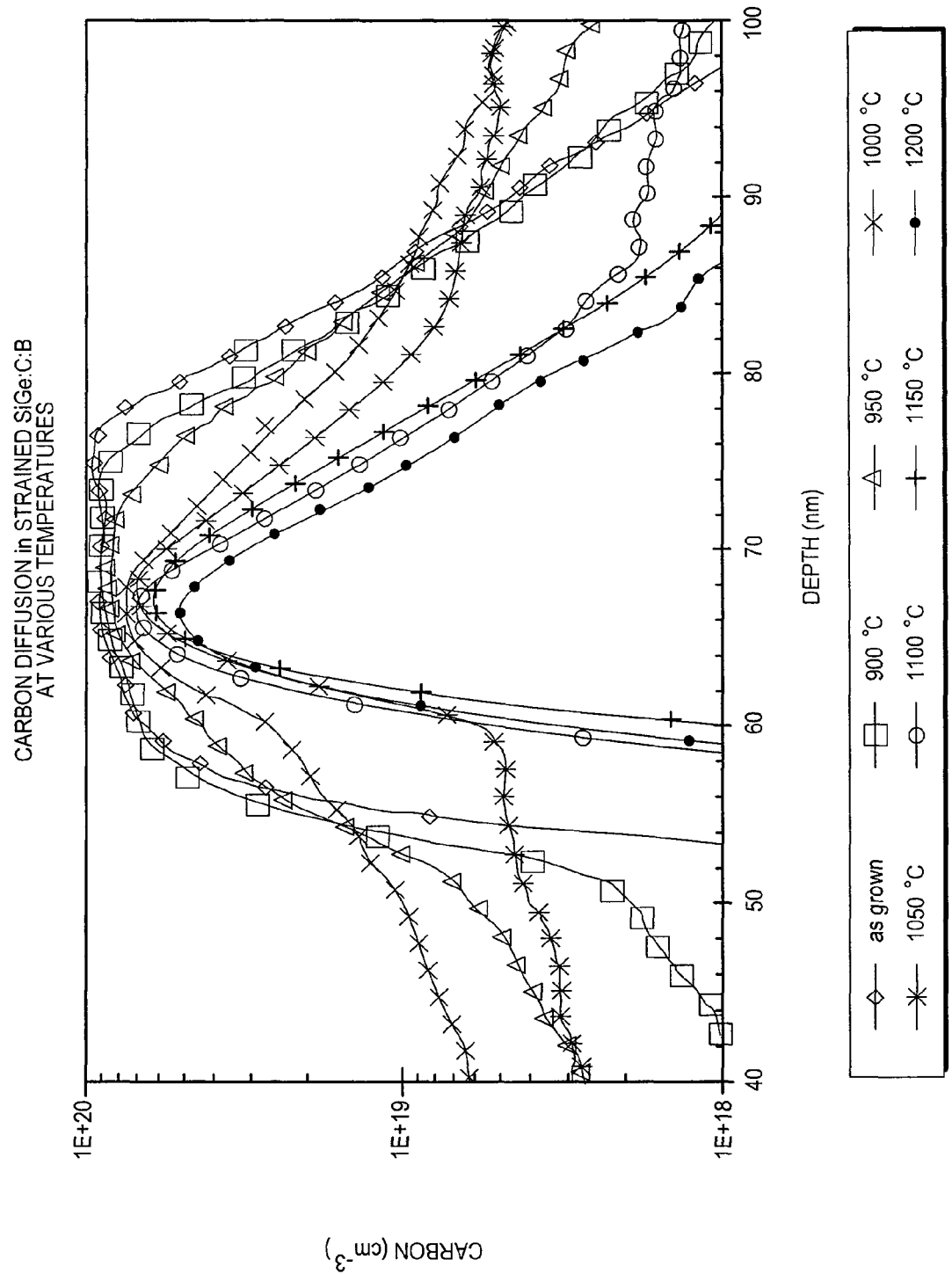
FIG. 5 is a graph indicating carbon diffusion depth in strained SiGe:C:B at various anneal temperatures.

FIG. 5 indicates, in another embodiment, a significantly lower ratio Si to Ge SIMS profile. Carbon diffusion levels in strained SiGe:C:B are indicated as grown and at subsequent anneal temperatures of 900° C. to 1200° C. The data show carbon diffusion primarily from undoped spacer regions (not shown) in which the spacer regions have no B doping. However, a center region of the SIMS profile (i.e., at a depth of roughly 60 nm to 80 nm) indicates that carbon diffusion is significantly mitigated due to the presence of B in the SiGe film. In this exemplary embodiment, the SiGe:C:B film is 79.5% Si, 20% Ge, 0.2% C, and 0.3% boron, prior to thermal anneal ($SiO_{0.795}Ge_{0.2}C_{0.002}B_{0.003}$). Thus a ratio of Si to Ge is approximately 4:1 and a ratio of B to C is approximately 1.5:1.

Figure 6:
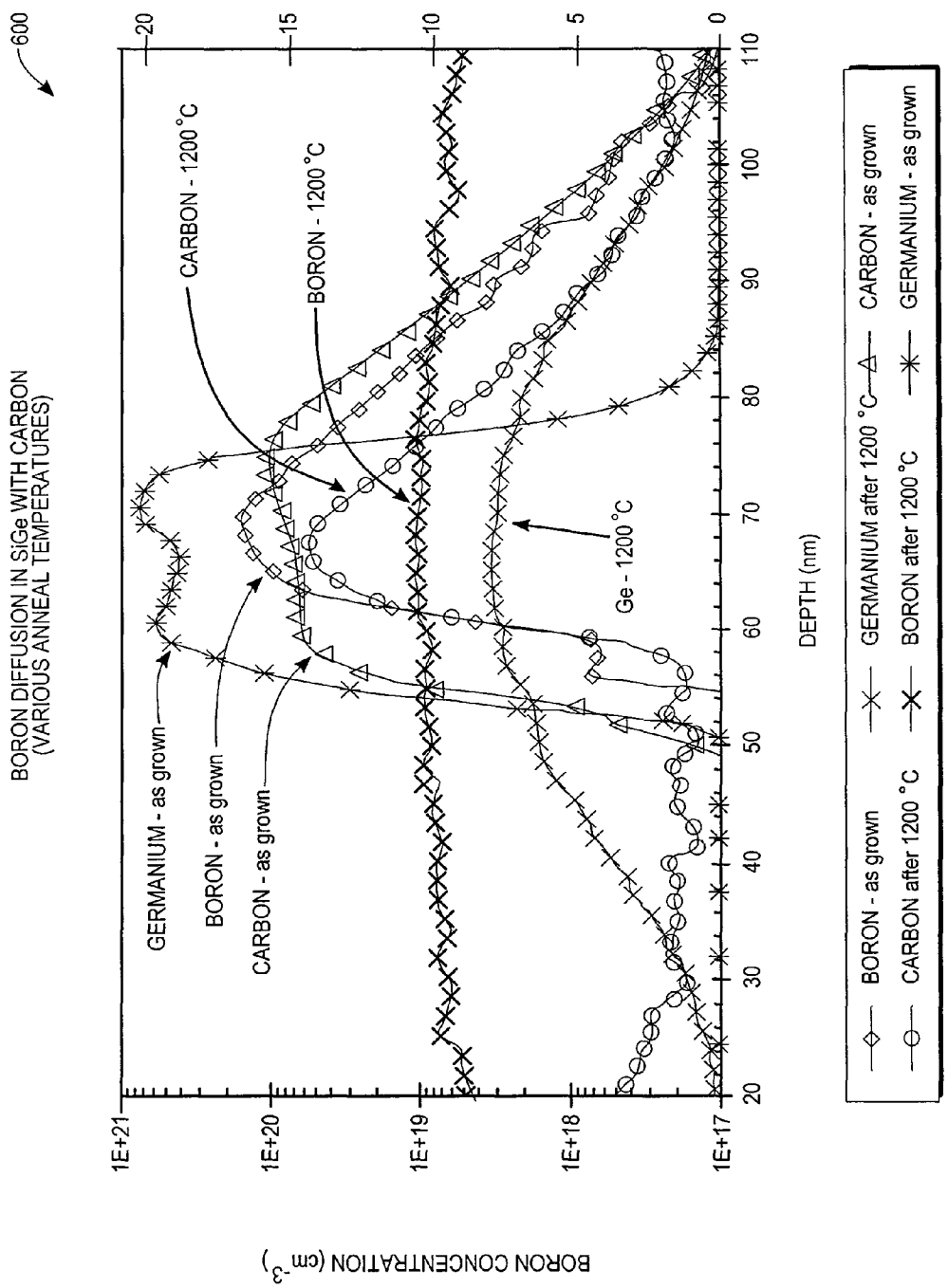
FIG. 6 is a graph indicating boron diffusion depth in SiGe with carbon at various anneal temperatures.

FIG. 6 is a SIMS profile 600 indicating boron diffusion depth in SiGe with carbon at various anneal temperatures. The SiGe film employed in this embodiment is also $Si_{0.795}Ge_{0.2}C_{0.002}B_{0.003}$, similar to the film used in producing the graph of FIG. 5. Note the SIMS profile 600 indicates that, following a 1200° C. anneal for 10 seconds, germanium has diffused from a peak of 20% (i.e., approximately $1.0 \times 10^{22}$ atoms/cm$^3$) to a peak concentration of 7.7% (i.e., approximately $3.85 \times 10^{21}$ atoms/cm$^3$). Boron has diffused from a peak of $1.5 \times 10^{20}$ atoms/cm$^3$ to a peak of $1.0 \times 10^{19}$ atoms/cm$^3$. Additionally, carbon has diffused but the diffusion mechanism involved is due primarily to the SiGe spacers (the outside edges that contained only Ge and C during the initial growth). The carbon peak has diffused from $1.0 \times 10^{20}$ atoms/cm$^3$ down to $7.0 \times 10^{19}$ atoms/cm$^3$ (indicating roughly a 30% peak reduction). The final diffused profile of the carbon is narrower than the as-grown profile. As a result, the final diffused carbon profile, even after a 1200° C. anneal is less than 20 nm wide at FWHM.

Fabrication Process for the Etch-Stop Layer

Overall, process conditions can vary widely depending upon particular devices fabricated, specific equipment types employed, and various combinations of starting materials. However, in a specific exemplary embodiment, the process conditions generally entail the following process conditions, generally at pressures from less than 1 Torr to about 100 Torr and temperatures from 450° C. to 950° C.

| Precursor Gas or Carrier Gas | Flow Rate | Notes |
|---|---|---|
| GeH$_4$ | 0 sccm to 500 sccm | 0 sccm for Si, not Ge |
| SiH$_4$ | 5 sccm to 500 sccm | 0 sccm for Ge, not Si |
| B$_2$H$_6$ | 0 sccm to 500 sccm | 0 sccm = no B in Si or SiGe |
| CH$_3$SiH$_3$ | 0 sccm to 500 sccm | 0 sccm = no C in Si or SiGe |
| He | 0 sccm to 500 sccm | Optional - used for low temperature growth (e.g., <500° C.) |
| H$_2$ | 1 slpm to 50 slpm | |

In addition to germanium tetrahydride (GeH$_4$), another germanium precursor gas may be employed. Additionally, disilane (Si$_2$H$_6$) or another silicon precursor gas may be used in place of silane ($SiH_4$). Disilane deposits silicon at a faster rate and lower temperature than silane.

Additionally, boron trichloride ($BCl_3$) or any other boron precursor gas may be used in place of diborane ($B_2H_6$). A carbon precursor gas other than methyl silane ($CH_3SiH_3$) may be employed as the carbon precursor. Inert gases such as nitrogen ($N_2$), argon (Ar), helium (He), xenon (Xe), and fluorine ($F_2$) are all suitable carrier gases to substitute for $H_2$ as well.

All gas flow rates may be process, equipment, and/or device dependent. Therefore, gas flow rates outside of the exemplary ranges given may be fully acceptable. Also, a skilled artisan will recognize that the $Si_{1-x-y-z}Ge_xC_yB_z$ layer may be deposited in various profiles as well depending upon electrical characteristics desired.

Amorphization Enhanced Etch-Stop

As noted in FIG. 3, an implanted. Ge profile is more resilient to outdiffusion than a CVD Ge profile. Therefore, additional process steps may be added. For example, following the CVD deposition of a SiGe:C:B nano-scale filmstack, an amorphization implant may be performed. The implant results in a reduction in film strain along a Si/SiGe heterojunction (contrary to contemporary literature findings). Therefore, by amorphizing the pseudomorphic SiGe:C:B layer the selectivity will be further enhanced. Species which have been found to be acceptable for this step include, among others, boron, germanium, silicon, argon, nitrogen, oxygen (monotonic), carbon, and Group III-V and Group II-VI semiconductors.

Fabrication of an HEMT Device

FIGS. 7A and 7B describe exemplary formation of an HEMT device, which may be transferred as a BESOI device layer. FIG. 7A includes a substrate with device layer 701 and a relaxed semiconductor layer 703 which serves both as an etch-stop layer and also contains the HEMT channel region (not shown). In a specific exemplary embodiment, the substrate with device layer 701 may comprise silicon. The relaxed semiconductor layer 703 may comprise SiGeC, SiGeB, and/or SiGe:C:B and formed in accordance with methods and elemental ratios described above.

With reference to FIG. 7B, a tensile-strained semiconductor cap layer 705 is formed over the relaxed semiconductor layer 703. In a specific exemplary embodiment, the tensile-strained cap layer comprises silicon. Semiconductors in tension have several advantageous properties. For example, placing silicon in tension increases the mobility of electrons moving parallel to a surface of the substrate 701, thus increasing a frequency of operation of the device. Also, a band offset between the relaxed SiGe and the tensile Si confines electrons in the Si layer. Therefore, in an electron channel device (n-channel), the channel can be removed from the surface or buried.

In an exemplary method of fabrication, the relaxed semiconductor layer 703 is formed by providing a hydrofluoric cleaning of surfaces of the substrate 701, followed by an isopropyl alcohol drying step. The substrate 701 is pre-baked at 950° C. for 60 seconds to remove adsorbed moisture and strip any weak oxides. A seed layer of silicon is grown to a thickness of approximately 300 Å by flowing $H_2$ at 30 slpm and $SiH_4$ at 50 sccm at a temperature of 900° C. The $SiH_4$ flow is maintained at 50 sccm while the temperature is reduced to 600° C. $GeH_4$ is introduced initially at a flow rate of 50 sccm and ramped up to 400 sccm to form a 2500 Å thick SiGe layer. A resultant profile from the flow rate ramping is, for example, trapezoidal in shape from a 5% concentration to a 25% concentration. Thus, a critical thickness is exceeded and the film will relax to its natural lattice dimension. Immediately prior to the final 2500 Å thickness being achieved, the etch-stop layer is produced by introducing either B and/or C via, for example, $B_2H_6$ and $CH_3SiH_3$. A flow rate of each gas is typically in a range of 200 sccm to 500 sccm. The strained cap layer 705 is then formed by discontinuing the $GeH_4$ flow while maintaining the $SiH_4$ at 50 sccm. An overall thickness of the cap layer 705 is determined by design requirements but will, generally be in a range of 50 Å to 200 Å for contemporary devices. As would be understood by a skilled artisan, all times, temperatures, flow rates, and concentrations are exemplary only and may be varied depending upon exact device and equipment choices.

FIG. 8 is a basic structure of an exemplary quantum well film stack 800. As described with reference to FIG. 7B above, strained Si (e.g., Si in tension) becomes a quantum well region. Hence, a greater propensity exists that electrons will flow in the quantum well region. The exemplary quantum well stack 800 includes a silicon substrate 801, a graded SiGe layer 803, a relaxed SiGe layer 805, and a strained silicon quantum well 807. Additionally, the relaxed SiGe layer 805 contains the etch-stop layer as described above. The nanoscale-level etch-stop layer provides a much tighter film uniformity than is possible with other contemporary SOI fabrication techniques, thus resulting in both reduced ion implant straggle and excessive diffusion of implanted species. Consequently, an electronic device fabricated as described herein has a concomitant increase in performance. For example, an overall effect of electron mobility due to the strained silicon quantum well 807 is quantified in FIG. 9.

FIG. 9 is an electron mobility enhancement graph indicating a mobility enhancement factor as a function of a germanium fraction in the underlying relaxed SiGe layer 805 (FIG. 8). The electron mobility enhancement graph further compares simulated data with experimental results. As the germanium fraction in the substrate (here, the relaxed SiGe layer 805) increases, a resultant larger SiGe lattice parameter occurs. The larger lattice parameter couples into a tensile strain in the silicon quantum well 807. The tensile silicon strain results in a reduction in phonon scattering and also a reduction in effective electron mass further improving device performance. As indicated, a mobility enhancement factor exceeding a factor of 1.8 has been achieved using techniques and methods described herein.

In the foregoing specification, embodiments of the present invention have been described with reference to specific embodiments thereof. It will, however, be evident to a skilled artisan that various modifications and changes can be made thereto without departing from the broader spirit and scope of the embodiments of the invention as set forth in the appended claims. For example, although process steps and techniques are shown and described in detail, a skilled artisan will recognize that other techniques and methods may be utilized which are still included within a scope of the appended claims. For example, there are frequently several techniques used for depositing a film layer (e.g., chemical vapor deposition, plasma-enhanced vapor deposition, epitaxy, atomic layer deposition, etc.). Although not all techniques are amenable to all film types described herein, one skilled in the art will recognize that multiple methods for depositing a given layer and/or film type may be used.

Additionally, many industries allied with the semiconductor industry could make use of the HEMT device disclosed herein. For example, a thin-film head (TFH) process in the data storage industry or an active matrix liquid crystal display (AMLCD) in the flat panel display industry could readily make use of the processes and techniques described herein. The term "semiconductor" should be recognized as including the aforementioned and related industries. The specification and drawings are, accordingly, to be regarded in an illustrative rather than a restrictive sense.

What is claimed is:

1. A method comprising:
   forming a relaxed silicon-germanium layer over a substrate of a device;
   forming an etch-stop layer in the silicon-germanium layer, the etch-stop layer including at least one of boron and carbon;
   forming a tensile-strained silicon layer over the silicon-germanium layer; and
   performing an amorphization implant in the etch-stop layer to reduce film strain along a heterojunction of the etch-stop layer and the tensile-strained silicon layer.

2. The method of claim 1, wherein forming the relaxed silicon-germanium layer is performed such that the relaxed silicon-germanium layer includes less than about 70% germanium.

3. The method of claim 1, wherein performing the amorphization implant comprises:
   forming the amorphization implant using a species selected from a group including boron, germanium, silicon, argon, nitrogen, oxygen, and carbon.

4. The method of claim 1, wherein performing the amorphization implant comprises:
   forming the amorphization implant using a species selected from a group including Group III-V and Group II-VI semiconductor materials.

5. The method of claim 2, wherein forming the tensile-strained silicon layer includes forming the tensile-strained silicon layer to act as a well region of the device.

6. The method of claim 5, wherein forming the relaxed silicon-germanium layer is performed such that the relaxed silicon-germanium layer has a thickness of less than about 70 nanometers when measured as a full-width half-maximum (FWHM) value.

7. A method comprising:
   forming a silicon-germanium layer over a substrate of a device such that the silicon-germanium layer including less than about 70% germanium;
   forming an etch-stop layer in the silicon-germanium layer;
   forming a silicon layer over the silicon-germanium layer such that the silicon layer acts as a well region of the device; and
   performing an amorphization implant in the etch-stop layer to reduce film strain along a heterojunction of the etch-stop layer and the silicon layer.

8. The method of claim 7, wherein the etch-stop layer is formed from at least boron.

9. The method of claim 7, wherein the etch-stop layer is formed from at least carbon.

10. The method of claim 7, wherein the etch-stop layer is formed to about less than 20 nanometers measured as a full-width half-maximum (FWHM) thickness value.

11. The method of claim 7, wherein performing the amorphization implant comprises:
   forming the amorphization implant using a species selected from a group including consisting of boron, germanium, silicon, argon, nitrogen, oxygen, and carbon.

12. The method of claim 7, wherein performing the amorphization implant comprises:
   forming the amorphization implant using a species selected from a group including Group III and Group V semiconductor materials.

13. The method of claim 7, wherein performing the amorphization implant comprises:
   forming the amorphization implant using a species selected from a group including Group II and Group VI semiconductor materials.

14. A method comprising:
   introducing a carrier gas over a substrate of a device in a chamber;
   introducing a silicon precursor gas into the chamber;
   introducing a germanium precursor gas into the chamber;
   forming a silicon-germanium layer such that the silicon-germanium layer contains less than about 70% germanium;
   introducing an additional precursor gas into the chamber;
   forming a silicon layer over the silicon-germanium layer such that the silicon layer acts as a well region of the device; and
   performing an amorphization implant in the silicon-germanium layer to reduce film strain along a heterojunction of the silicon-germanium layer and the silicon layer.

15. The method of claim 14, wherein introducing the additional precursor gas includes flowing boron into the chamber.

16. The method of claim 14, wherein introducing the additional precursor gas includes flowing carbon into the chamber.

17. The method of claim 14 further comprising:
   annealing the substrate to a temperature of at least 900 degree. C.

18. The method of claim 14, wherein performing the amorphization implant comprises:
   adding the amorphization implant into the chamber, the amorphization implant being selected from a group including boron, germanium, silicon, argon, nitrogen, oxygen, and carbon.

19. The method of claim 14, wherein performing the amorphization implant comprises:
   adding the amorphization implant into the chamber, the amorphization implant being selected from a group including Group III and Group V semiconductor materials.

20. The method of claim 14, wherein performing the amorphization implant comprises:
   adding the amorphization implant into the chamber, the amorphization implant being selected from a group including Group II and Group VI semiconductor materials.

21. The method of claim 16, wherein introducing the additional precursor gas is to form at least a portion of an etch-stop layer in the silicon-germanium layer.

22. The method of claim 16 wherein introducing the additional precursor gas is to form at least a portion of a dopant layer in the silicon-germanium layer such that the dopant layer has a thickness of less than about 70 nanometers when measured as a full-width half-maximum (FWHM) thickness value.

* * * * *

UNITED STATES PATENT AND TRADEMARK OFFICE
CERTIFICATE OF CORRECTION

| | |
|---|---|
| PATENT NO. | : 8,173,526 B2 |
| APPLICATION NO. | : 12/489353 |
| DATED | : May 8, 2012 |
| INVENTOR(S) | : Darwin Gene Enicks |

It is certified that error appears in the above-identified patent and that said Letters Patent is hereby corrected as shown below:

Page 3, Column 1, line 6 (Other Publications), please delete "maied" and insert therefor --mailed--;

Page 3, Column 2, line 3 (Other Publications), please delete "Internatonal" and insert therefor --International--;

Page 3, Column 2, line 5 (Other Publications), please delete "Internatonal" and insert therefor --International--;

Page 3, Column 2, line 53 (Other Publications), please delete "(Photonic" and insert therefor --Photonic--;

Column 2, line 40, please delete "retching" and insert therefor --etching--;

Column 2, line 59, please delete "2038." and insert therefor --203B--;

Column 6, line 8, please delete "Of" and insert therefor --of--;

Column 7, line 17, please delete "implanted." and insert therefor --implanted--; and Column 9, line 60, claim 1, please delete "consisting of".

Signed and Sealed this
Tenth Day of July, 2012

David J. Kappos
*Director of the United States Patent and Trademark Office*